(12) United States Patent
Sibrai et al.

(10) Patent No.: US 7,583,127 B2
(45) Date of Patent: Sep. 1, 2009

(54) HIGH Q LINEAR CONTROLLED VARIABLE CAPACITOR USING TRANSLINEAR AMPLIFIER

(75) Inventors: Andreas Sibrai, Krottendorf (AT); Josef Niederl, Klogenfurt (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 136 days.

(21) Appl. No.: 10/764,914

(22) Filed: Jan. 26, 2004

(65) Prior Publication Data

US 2005/0151575 A1 Jul. 14, 2005

(30) Foreign Application Priority Data

Jan. 14, 2004 (EP) .................................. 04368004

(51) Int. Cl.
G06F 7/64 (2006.01)
(52) U.S. Cl. .................... 327/337; 327/334; 327/341
(58) Field of Classification Search ................. 327/337, 327/393, 396, 532; 331/158, 25; 330/86
See application file for complete search history.

(56) References Cited

U.S. PATENT DOCUMENTS

| | | | | |
|---|---|---|---|---|
| 4,449,141 A | | 5/1984 | Sato et al. ..................... 357/14 |
| 4,456,917 A | | 6/1984 | Sato et al. ..................... 357/14 |
| 4,730,095 A | * | 3/1988 | Richter-Jorgensen .. 219/121.85 |
| 4,814,640 A | * | 3/1989 | Miyake ........................ 327/564 |
| 5,471,173 A | * | 11/1995 | Moore et al. ................. 330/256 |
| 5,514,999 A | | 5/1996 | Koifman et al. ................ 330/9 |
| 6,013,958 A | * | 1/2000 | Aytur ........................... 307/109 |
| 6,356,135 B1 | | 3/2002 | Rastegar ....................... 327/337 |
| 6,559,730 B1 | * | 5/2003 | Marvin et al. ................. 331/158 |
| 6,577,180 B2 | * | 6/2003 | Liu ............................... 327/532 |
| 2003/0067362 A1 | | 4/2003 | Losehand et al. ........ 331/177 V |

FOREIGN PATENT DOCUMENTS

WO    WO 01/06637 A    1/2001

OTHER PUBLICATIONS

U.S. Appl. No. 10/676,919, filed Oct. 1, 2003, assigned to the same assignee.
U.S. Appl. No. 10/764,920, filed Jan. 26, 2004, assigned to the same assignee.
"Improved Switched Tuning of Differential CMOS VCOs", by Sjoland, IEEE Trans. on Circuits and Systems—II: Analog and Digital Signal Proc., vol. 49, No. 5, May 2002, pp. 352-355.

* cited by examiner

*Primary Examiner*—Lincoln Donovan
*Assistant Examiner*—Hiep Nguyen
(74) *Attorney, Agent, or Firm*—Saile Ackerman LLC; Stephen B. Ackerman

(57) ABSTRACT

A voltage controlled variable capacitor, formed of a larger number of fixed capacitor segments and a corresponding number of switching elements, uses translinear amplifiers to control each switching element. Each translinear amplifier linearly switches from the fully off to the fully on state; a minimum number of switching stages (ideally only one) is in the mode-of-change at any one time with a minimum overlap. The arrangement achieves a nearly linear change of capacitance at linear tuning voltage change, while resulting in high Q-factor due to the low RDSon and high RDSoff of the fully switched stages. The invention eliminates temperature and voltage dependencies of other solutions like varactor diodes.

47 Claims, 11 Drawing Sheets

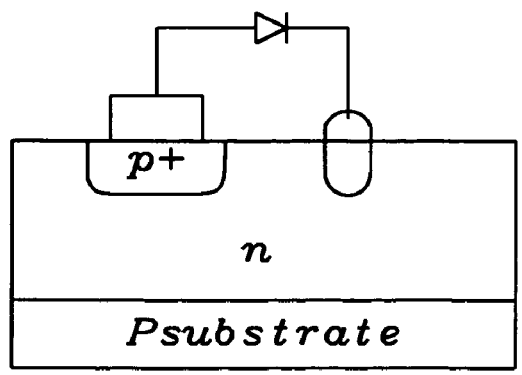
FIG. 1a – Prior Art
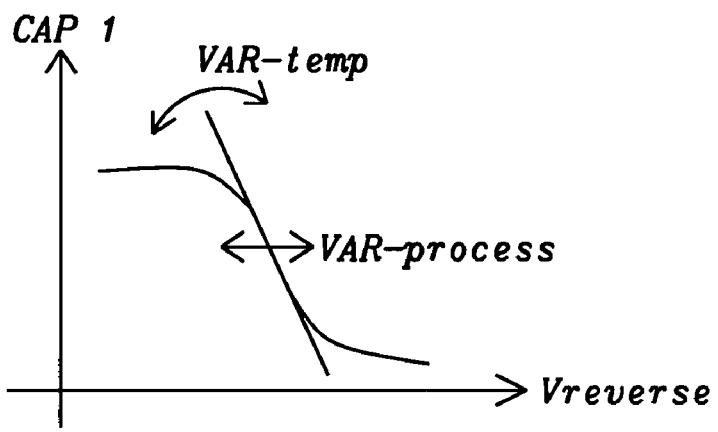
FIG. 1b – Prior Art
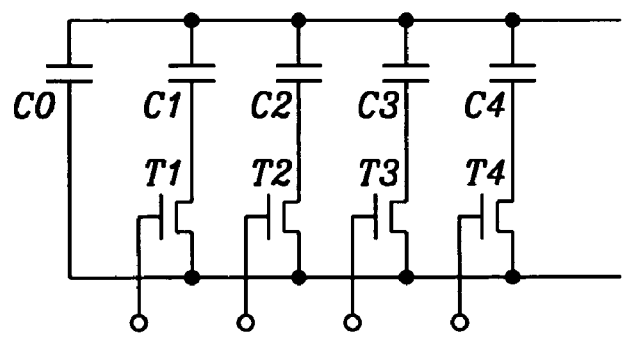
FIG. 2a – Prior Art

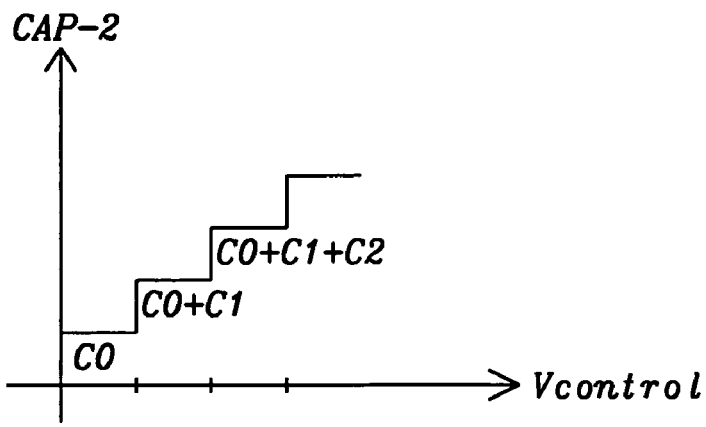
*FIG. 2b - Prior Art*
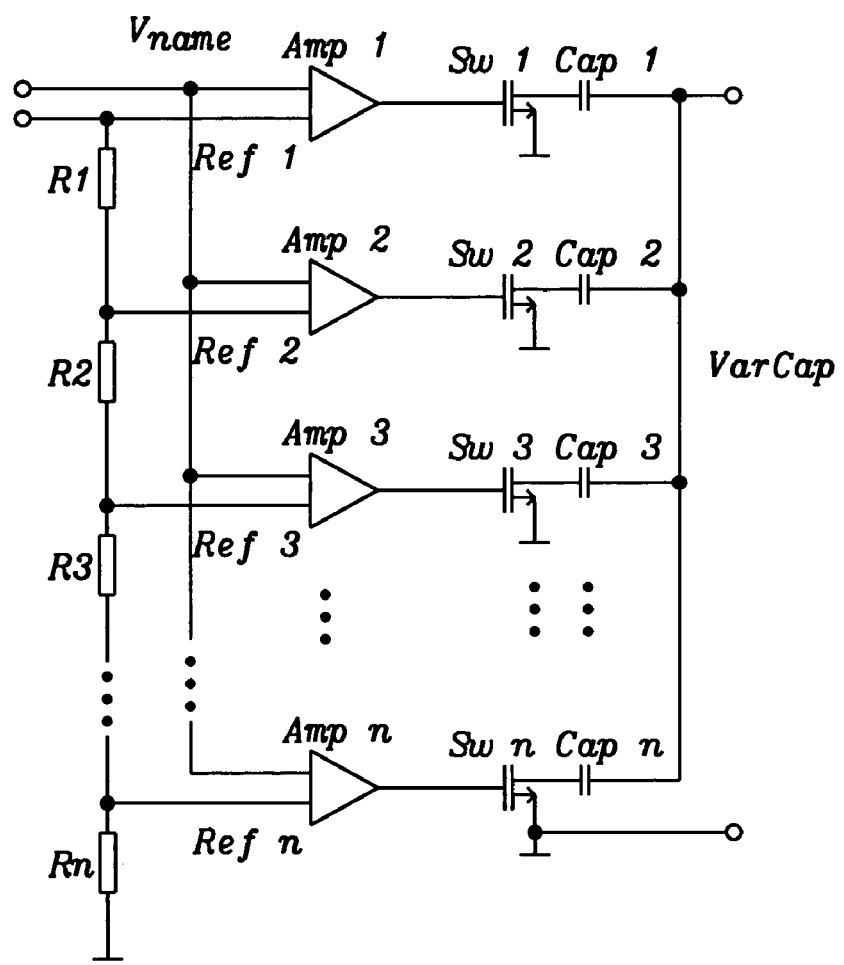
*FIG. 3*

HIGH Q LINEAR CONTROLLED VARIABLE CAPACITOR USING TRANSLINEAR AMPLIFIER

RELATED PATENT APPLICATION

This application is related to U.S. patent application Ser. No. 10/764,920 filed concurrently herewith on Jan. 26, 2004 and U.S. patent application Ser. No. 10/676,919 filed Oct. 1, 2003, now issued as U.S. Pat. No. 6,937,098, and assigned to the same assignee as the present invention.

BACKGROUND OF THE INVENTION (1) Field of the Invention

The invention relates to a voltage controlled variable capacitor, and more particularly, to a variable capacitor, formed of a larger number of fixed capacitor segments and a corresponding number of switching elements, which are typically integrated with the capacitance controlling functions on an integrated semiconductor circuit.

(2) Description of Prior Art

One example of a voltage-controlled capacitor is a varactor diode. When a reverse voltage is applied to a PN junction, it creates a depletion region, essentially devoid of carriers, which behaves as the dielectric of a capacitor. The depletion region increases as reverse voltage across it increases; thus the junction capacitance will decrease as the voltage across the PN junction increases. However the characteristics are non-linear and are widely temperature and process dependent. There is also a significant leakage current problem. Varactor diodes must be operated below the junction breakdown voltage. The varactor diode is sometimes called a varicap.

FIG. 1a shows the principle of a varactor diode; FIG. 1b shows the control voltage to capacitance characteristics of said varactor diode and demonstrates the effects of temperature and process variations. Another example is a switched capacitor chain, where capacitors are switched in parallel one after the other, thus increasing the capacitance step by step. The capacitors, when made of metal or polycarbonate structures, are far less sensitive to temperature and process deviations.

FIG. 2a shows the basic circuit concept. However, as is demonstrated in FIG. 2b, there is only a "step-wise linear" capacitance change over the control voltage. In addition the switching of the individual capacitors causes switching noise ("spikes") on the common circuit rails. Furthermore, while the switching transistor is kept in flat switching ramp to smooth the switching steps, the transistor's resistance causes a Q-factor problem.

U.S. Pat. No. 6,356,135 (to Rastegar) describes an electronically trimable capacitor having a plurality of branch circuits, each including a capacitor which may be selectively controlled by a switch to contribute or not to the net capacitance exhibited by the trimable capacitor. Operation of the switches is under direction of digital instruction.

U.S. Pat. No. 5,514,999 (to Koifman, et al.) shows a differential switched capacitor circuit, comprising: multiple switched capacitor stages, coupled in a chain.

U.S. Pat. Nos. 4,449,141 and 4,456,917 (to Sato, et al.) disclose a variable capacitor comprising a plurality of variable capacitor elements each having depletion layer control sections and a capacity reading section formed on a semiconductor substrate so that the capacity appearing at each capacity reading section varies in response to the bias voltage applied to the depletion layer control sections.

SUMMARY OF THE INVENTION

A principal object of the invention described in the present document is to control the capacitance of a variable capacitor in a strictly linear mode through a tuning voltage. A fundamental requirement is to achieve a high Q-factor at the same time.

The basic aspects of a mechanism to linearly control the capacitance of a variable capacitor in a linear mode through a tuning voltage are described in a related patent application. This related patent application, which is entitled "High Q linear controlled variable capacitor" U.S. patent application, Ser. No. 10/764,920, filed Jan. 26, 2004), is hereby incorporated by reference.

In accordance with the objectives of this invention, a circuit to implement a voltage controlled variable capacitor, operating in a linear mode and maintaining High Q-Factor is achieved. The invention disclosed in the referenced patent application (U.S. Ser. No. 10/764,920) added circuits and methods to linearize the capacitance change and to minimize the effect of parasitic resistance in the capacitor switching elements, which would degrade Q-factor. The herewith disclosed invention further implements a translinear amplifier and adds additional circuits to further reduce the effect of parasitic resistance and of temperature deviation.

In the same way as described in the referenced patent application (U.S. Ser. No. 10/764,920), within a set of small capacitors, one capacitor after the other is switched in parallel to change the total sum of capacitance. To achieve a linear capacitance change, said capacitors are not switched on one by one in digital steps, however each capacitor is switched on partially in a sliding operation, starting at low value (0% of its capacitance) and ending with the fully switched on capacitor (100% of its capacitance), i.e. the capacitor is switched on with increasing (or decreasing) share. To achieve said sliding switch operation, a typical implementation uses FET-type transistors as switching device, one per capacitor. The switching operation of such FET-type transistor can be divided into three phases: the fully-switched-off phase (said FET transistor's drain-source-resistance RDS is very high), a steady ramp-up/ramp-down phase or steady transition phase (that is: said FET transistor's resistance RDS is changing between very high resistance and very low resistance in a linear and steady mode) and the fully-switched-on phase (said FET transistor's drain-source-resistance RDS is very low). By thoroughly controlling such switching device within said linear and steady ramp-up/ramp-down phase, the capacitor in series with said switching device is partially switched in parallel with a well-controlled proportion between 0% and 100%.

The terms "steady ramp-up/ramp-down phase" or "steady transition phase" (and "steady ramp-up/ramp-down area" or "steady transition area") are used as synonyms throughout this document. The term "area" in this context is used to express the "operating range"—the term "phase" is used to express the "operation in process" within said area.

One key point to obtain highest possible Q-factor is to have at any time only one (or very few) transistor in the steady transition phase, i.e. RDS changing mode; all other transistors are either fully switched on or fully switched off. To achieve this goal, an individual threshold level for each capacitor switching stage defines the point where, in relation to the tuning voltage, each of said capacitor switching stages switches from the off to the on state. Overlapping of neighboring switching stages cannot be completely eliminated, but overlapping is kept to a minimum by selecting appropriate threshold parameters.

Key element to achieve the goal of the invention is the introduction of a translinear amplifier into the signal path. Furthermore, functions to limit the switching-signal in order to drive the capacitor-switching element, typically a FET-transistor, into minimum RDSon or maximum RDSoff are added. Even further, a circuit to compensate the temperature effect of the capacitor switching device is added.

The translinear amplifier, typically with a gain of 1, compares a differential voltage at its inputs and provides the same differential voltage at its outputs; i.e. the output difference of said amplifier strictly follows the difference at said amplifier inputs, independent of the absolute voltage level at the outputs; input and output are perfectly decoupled. Said translinear amplifier can operate at different absolute voltage levels at their input and work independent at an output level, best suitable for said switching transistor's operation.

While the switching transistor is kept within its steady transition phase (RDS steady changing mode) the resistance of said switching transistor linearly follows the input difference of said translinear amplifier. As said translinear amplifier can operate at different absolute voltage levels at their input and output, the resulting level shifting operation is best suitable for said switching transistor's operation.

Additional circuit elements, described in the related U.S. patent application Ser. No. 10/676,919, filed Oct. 1, 2003, titled "Translinear Amplifier" and hereby incorporated by reference, implement a signal cutoff function by providing a signal to sharply cut off said translinear amplifier's linear operation, once the defined linear operating range is exceeded at the negative end of said linear operating range; and to sharply limit said translinear amplifier's linear operation, once the linear operating range is exceeded at the positive end of said linear operating range. The circuits of said signal cutoff functions then either takes over control of said switching transistor to either drive it into deep saturation (RDSon going to 0) or drive it into its extreme off state (RDSoff going very high), when said switching device operates outside its desired steady transition phase.

There are various techniques to generate a set of reference values defining the threshold levels for the input and output reference levels of each of said translinear amplifier stages. And there are various techniques to provide a tuning voltage, dedicated for the voltage controlled capacitance change, to all of said amplifier stages.

The total concept according to the proposed invention is shown in FIG. 6. One key point of the invention is the implementation of signal cutoff functions at both ends of the steady ramp-up/ramp-down phase. Once the signal controlling the switching device leaves the steady transition phase, the signal condition is changed abrupt. FIG. 7b visualizes this effect. The purpose is to drive said switching device to a fully-on state, when said switching device operates outside its steady transition area on the low resistance side (low RDSon) of said switching device and, in a complementary way, to drive said switching device to a fully-off status, when said switching device leaves its steady transition area on the high resistance side (high RDSoff).

Depending on the technique to implement the reference values for each of the translinear amplifiers within a chain of said capacitor switching stages, even specific nonlinear relations of capacitance change versus tuning voltage can be constructed.

In accordance with the objectives of this invention, a set of individual capacitors is implemented. Such capacitors could, for example, be discrete metal or polymer capacitors on a common planar carrier or they could be integrated on a semiconductor substrate. The switching device is typically a FET transistor, which could be for example a P-channel or N-channel junction FET or a PMOS or NMOS FET.

The amplifier primarily generating the control signal for the switching devices is, according to the invention, a translinear amplifier, as described in patent application, U.S. Ser. No. 10/676,919, filed Oct. 1, 2003. In addition, signal cutoff functions, which are designed to drive said switching device to a fully-on status, when said switching device operates outside its steady transition area on the low resistance side (low RDSon) or to drive said switching device to a fully-off status, when said switching device operates outside its steady transition area on the high resistance side (high RDSoff), can be implemented. Such signal cutoff functions could, according to the invention, be implemented with additional circuit elements within the translinear amplifier. They could however be implemented as separate circuits as well.

The circuit also provides the components to generate the set of reference voltages for the threshold levels of each capacitor switching stage. A resistor chain is one possible solution. The amplifiers within each capacitor switching stage then use the tuning voltage supplied and said reference voltages to generate the control signal for said switching devices, which then switch the capacitors in parallel, one after the other.

Furthermore, the temperature deviation, caused by the temperature characteristics of the switching device can be compensated. One concept is to use a device of the identical type of the switching device to produce a temperature dependent signal and feed it as compensating voltage into the output reference point of the translinear amplifier. This will mirror the exact equivalent of the temperature error into the switching control signal and compensate its temperature error. Details of a possible implementation are provided in the related patent application U.S. Ser. No. 10/676,919.

Even further, a specific non-linear characteristic of the tuning voltage to capacitance relation can be achieved by dimensioning the relation between said tuning voltage and said individual threshold levels as desired. In one proposed solution, the individual steps of the reference resistor chain will be dimensioned to a desired nonlinear curve, for example when the steps between the threshold levels, where the next capacitor starts to be switched on, are narrower in one area than in other areas, more capacitors start to be switched in parallel and a steeper change of total capacitance can be achieved.

A translinear amplifier typically has a gain of 1. However, a gain different from 1 is also achievable, which, if implemented, gives one more degree of freedom in dimensioning and optimizing certain operating parameters. For example, the remaining overlapping of neighboring capacitor switching stages may be even further reduced, as the steepness of the steady ramp-up/ramp-down operation can be controlled with adequate selection of the gain.

In accordance with the objectives of this invention, a method to control the capacitance of a variable capacitor in a strictly linear mode through a tuning voltage and to achieve a high Q-factor at the same time generate, is achieved. One method is to switch a variable number of capacitors in parallel, where only one is in the steady transition phase of being switched on (or off) in a steady progressing mode (i.e. the effective capacitance being ramped-up or ramped-down). All other capacitors of a larger number of capacitors are either already fully switched on or are still complete switched off. One key method is to linearly control the switching function for each of said switching devices, when said switching device is in an analog mode within the steady transition phase but to change the signal abrupt, as soon as the control signal for said switching function leaves its steady transition area. One method drives said switching device to a fully-on status, when said switching device operates outside its steady transition area on the low resistance side. A similar method drives said switching device to a fully-off status, when said switching device is beyond its steady transition area on the high resistance side. A further method amplifies, by a translinear amplifier, the difference of the capacitance tuning voltage and the reference voltage of each amplifier stage, producing the linear control signal for said steady progressing switching operation. Another method generates a set of reference values, one for each of said amplifier stages. Finally, the circuit supplies a tuning voltage, dedicated for the voltage controlled capacitance change, to all of said amplifier stages.

A further method compensates the temperature effect of the switching device. It generates a temperature dependent compensation voltage by using an identical device-type as the switching device and feeds the resulting signal into the output reference point of the translinear amplifier.

An even further method is to produce threshold levels along a non-linear curve, i.e. by not spreading said threshold levels with equal distances in order to get a desired non-linear relation of the total capacitance change versus tuning voltage.

BRIEF DESCRIPTION OF THE DRAWINGS

In the accompanying drawings, forming a material part of this description, there is shown:

FIG. 1a (Prior Art) shows a simplified structure of a varactor diode.

FIG. 1b (Prior Art) shows the relation of the capacitor over tuning voltage change and shows the effects of temperature and process variation.

FIG. 2a, and 2b (Prior Art) shows a principal circuit of a switched capacitor chain and the relation of the capacitor over tuning voltage change.

FIG. 3 shows a circuit with operational amplifiers in the control signal path and with a chain of resistors as reference voltage circuit.

DESCRIPTION OF THE PREFERRED EMBODIMENTS

The objectives of this invention are to control the capacitance of a variable capacitor in a strictly linear mode through a tuning voltage. A fundamental requirement is to achieve a high Q-factor at the same time.

A discussion of the general principles of a voltage controlled variable capacitor with linear characteristic, formed of a larger number of fixed capacitor segments and a corresponding number of switching elements, using operational amplifiers is disclosed in the related U.S. patent application Ser. No. 10/764,920, filed Jan. 26, 2004, the entire contents of which is incorporated herewith by reference.

FIG. 3 shows a principal circuit diagram of the referenced related patent application. A set of circuits to control the switching operation in a ramp-up/ramp-down manner, contains, typically besides other components, the set of operational amplifiers Amp 1 to Amp n. Sw 1 to Sw n are said switching devices and Cap 1 to Cap n are said capacitors that will be switched in parallel. As an example, a resistor chain R1 to Rn, or a similar circuit, produces a series of voltage references Ref 1 to Ref n and each of said operational amplifiers compares the tuning voltage input with its dedicated reference voltage. The resulting variable capacitance is available at the output connector varCap. As a minimum circuit implementation, a simple wire connection feeds the tuning voltage directly to the amplifier inputs.

Figure 6:
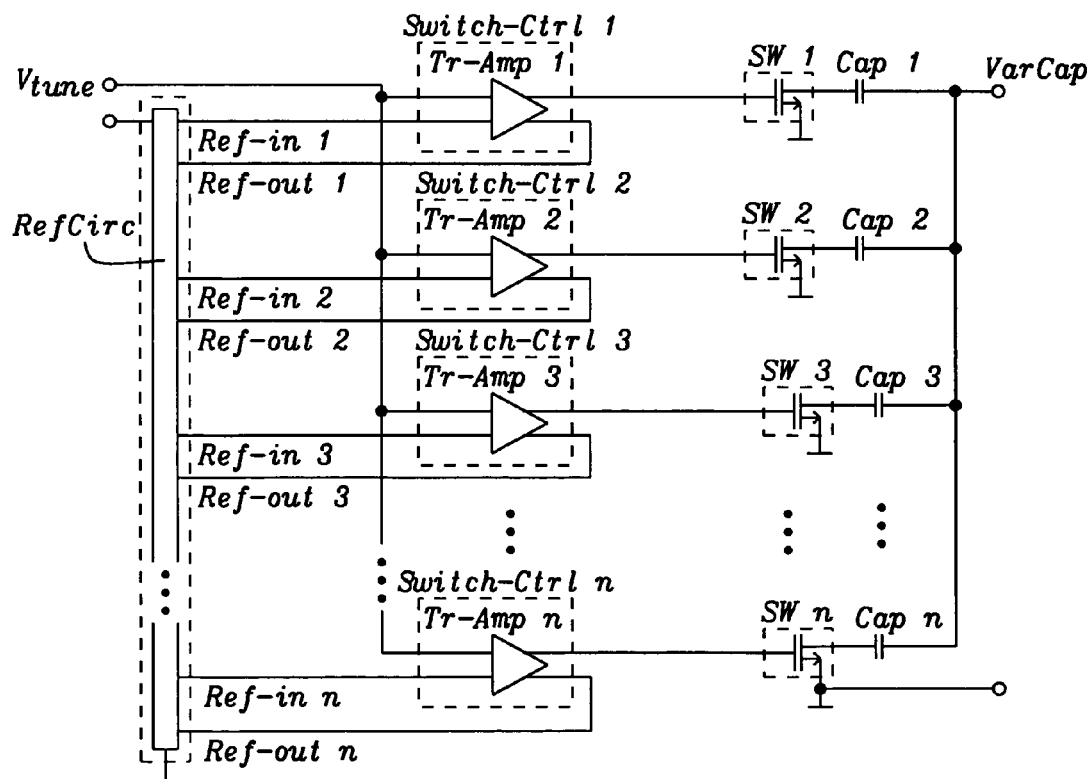
FIG. 6 shows the circuit schematic of multiple capacitor switching stages, each comprising a translinear amplifier, in accordance with an embodiment of this invention.

The herewith disclosed invention replaces said operational amplifiers of the referenced related patent application Ser. No. 10/764,920 with translinear amplifiers, as shown in FIG. 6.

According to the objectives of this invention, the operational amplifiers, within said set of circuits to control the switching operation in a ramp-up/ramp-down manner, as shown in FIG. 3, are replaced by translinear amplifiers. A single stage of said capacitor switching function is presented in FIG. 5 and the total circuit schematic for multiple stages according to the proposed invention is shown in FIG. 6, where a set of circuits to control the switching operation in a ramp-up/ramp-down manner, contains, typically besides other components, the set of translinear amplifiers. Key advantage is the fact, that the voltage levels at the translinear amplifier inputs and at the translinear amplifier outputs are independent, only the differential voltage at the inputs and at the outputs is important. Said translinear amplifier works in this context as a level shifter. Such translinear amplifiers have typically a gain of 1.

Figure 5:
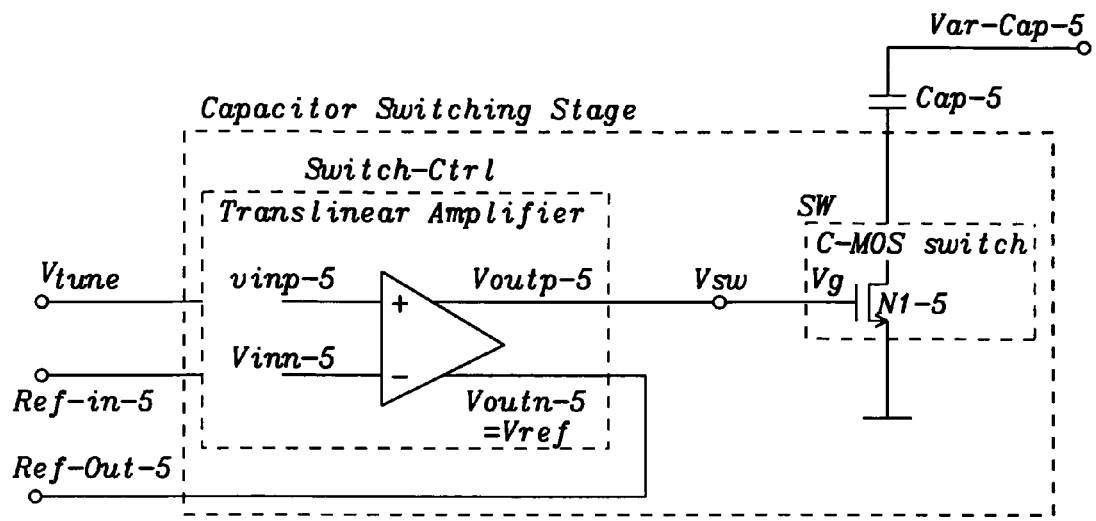
FIG. 5 shows the principal circuit arrangement of a single capacitor switching stage with a translinear amplifier.

The translinear amplifier in FIG. 5, imbedded within said circuit to control the switching operation Switch-Ctrl compares the differential voltage at its inputs Vinp-5 and Vinn-5 and, through various current mirroring techniques, provides the same differential voltage at its outputs Voutp-5 and Voutn-5; i.e. the output difference of said amplifier strictly follows the input difference, independent of the absolute voltage level at the outputs. Similar to Differential Amplifiers, a Translinear Amplifier has differential inputs and has differential outputs. In fact, the outputs are floating together, however the signal Voutn-5 may also be forced to any desired reference level—then the voltage at Voutp-5 will always follow that forced reference level with a difference of Voutp-5−Voutn-5=Vinp-5−Vinn-5. It should be noted at this point, that signal Voutn-5 effectively operates as an input signal, though it is drawn on the right side of the amplifier symbol, which normally represents output signals—Voutn-5 operating as an input allows to apply a desired output reference level, A single capacitor switching stage, as shown in FIG. 5, contains a circuit to control the switching operation Switch-Ctrl (also called hereafter the switch control circuit), a switching device SW and a small capacitor Cap. Said circuit to control the switching operation receives a signal, dependent on the tuning voltage Vtune, an input reference signal Ref-in-5 and an output reference signal Ref-out-5, where said input reference signal Ref-in-5 is then provided to the input reference point Vinn-5 and said output reference signal Ref-out-5 is then provided to the output reference point Voutn-5. The translinear amplifier in FIG. 5, imbedded within said circuit to control the switching operation Switch-Ctrl, possibly together with some electronic glue components, compares the differential voltage at its inputs Vinp-5 and Vinn-5 and provides the same differential voltage at its outputs Voutp-5 and Voutn-5; i.e. the output difference of said amplifier strictly follows the difference at said amplifier inputs, additionally controlled by applying a reference voltage level at output Voutn-5. Said switch control circuit Switch-Ctrl then provides a switch control signal Vsw, based on said translinear amplifier's output signal Voutp-5 to said switching device SW. Switch control signal Vsw then drives a current switching device N1-5 with the gate voltage Vg-5 to switch on said individual small capacitor Cap-5 in the proposed steady ramp-up/ramp-down manner. Switching in said steady ramp-up/ramp-down manner results in the desired variable capacitance Var-Cap-5 of said single capacitor switching stage.

Each of said translinear amplifiers can operate at a different absolute voltage level at their input and work independent at another output level. In this way the network to generate the reference voltages can be optimized independently for each stage, because the voltage level best suitable for the control operation of each switching transistor can be freely selected. In the circuit shown in FIG. 6 as an example, a common reference circuit RefCirc individually provides the input and output reference voltages to each of said switch control circuits Switch-Ctrl with their imbedded translinear amplifiers Tr.Amp 1 to Tr.Amp n, As described with FIG. 5, said translinear amplifiers can individually adjust between said input reference voltage levels Ref-in 1 to Ref-in n and said output reference levels Ref-out-1 to Ref-out-n. Then each of said translinear amplifiers provides its signal to control the switching devices Sw 1 to Sw n, which in turn switch on the individual small capacitors Cap 1 to Cap n in the proposed steady ramp-up/ramp-down manner. Each of said capacitor switching stages connects to one capacitor Cap k out of a set of small capacitors. Each of said capacitor switching stages is controlled through the common input signal Vtune and an individual input reference Ref-in k. All of these stages k=1 to n have basically identical functional characteristics.

Figure 10A:
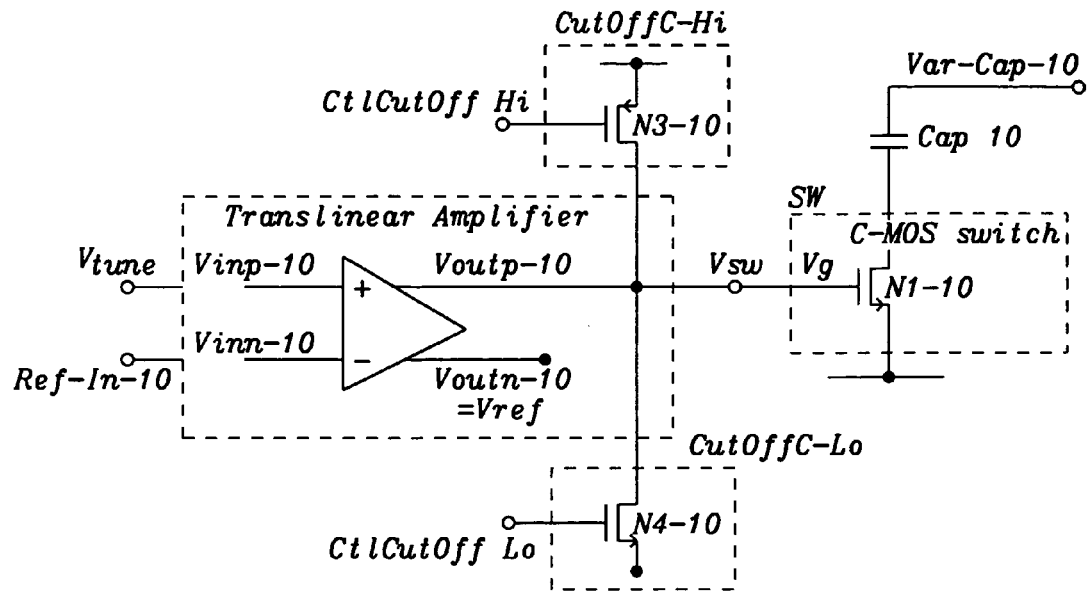
FIG. 10a shows the additional circuits to provide the cutoff signals to drive the switching devices to a fully off or fully on state.
Figure 10B:
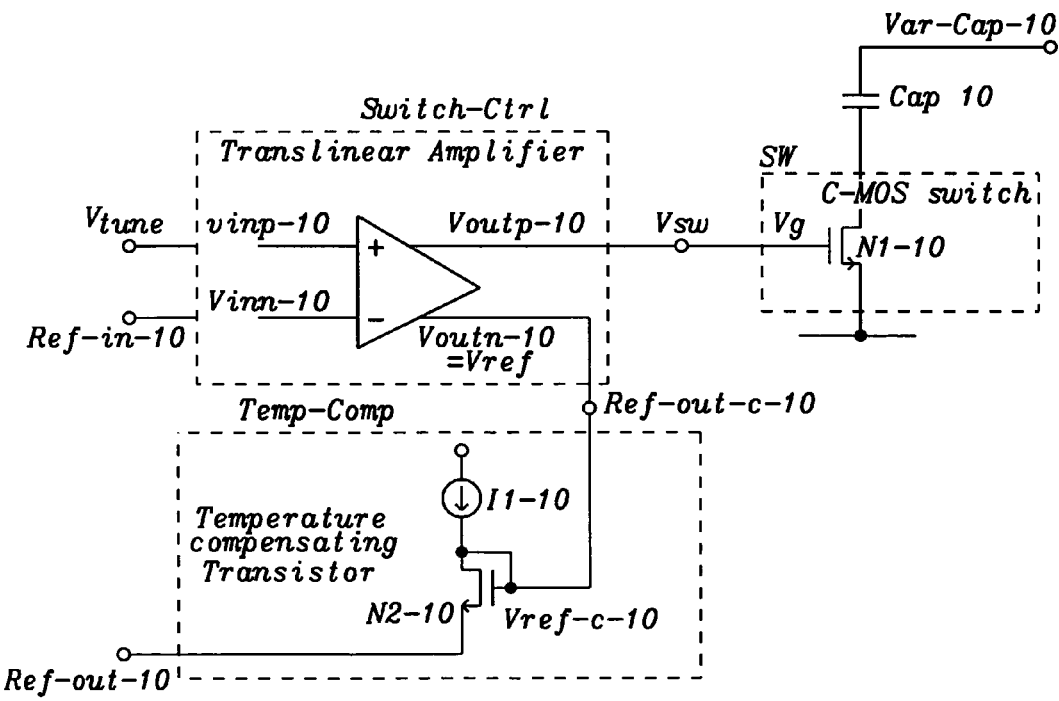
FIG. 10b shows a circuit added to modify the reference voltage for temperature compensation.

In the same way as described in said related patent application U.S. Ser. No. 10/764,920, within a set of small capacitors Cap 1 to Cap n, one capacitor after the other is switched in parallel to change the total capacity. Each capacitor has its individual switching device Sw 1 to Sw n. To achieve a linear capacitance change, said capacitors are not switched on one by one in digital steps, however each capacitor is switched on partially in a sliding operation, starting at low value (0% of its capacitance) and ending with the fully switched on capacitor (100% of its capacitance), i.e. the capacitor is switched on with increasing (or decreasing) share. To achieve said sliding switch operation, a typical implementation uses FET-type transistors, one per capacitor. The switching operation of such FET-transistor can be divided into three phases: the fully-switched-off phase (the FET transistor's drain-source-resistance RDS is very high), a steady ramp-up/ramp-down phase or steady transition phase, where the series resistance of said FET-transistor linearly follows the gate voltage and steadily changes from high to low values or vice versa, and the fully-switched-on phase (said FET transistor's drain-source-resistance RDS is very low). FIG. 10b in U.S. patent application Ser. No. 10/764,920, included by reference, visualizes the principal RDSon characteristic versus gate voltage of the switching devices N1-5 of a single capacitor switching stage according to FIG. 5 of the present application. By thoroughly controlling such switching device within said steady ramp-up/ramp-down or steady transition area, the capacitor in series with said switching device is effectively switched in parallel to the other capacitors with a well-controlled proportion between 0% and 100%. "Steady" is meant in the mathematical sense of being free of jumps or breaks. The limits of said steady ramp-up/ramp-down or steady transition area is distinguished by the points, where a further change of the controlling signal of the switch does not lead to further decrease or increase of the series resistance of said switching device (except for a small, negligible change).

In case a specific member of said switching devices, as shown in FIG. 6, is switched fully-on, the parallel connection of the capacitor (in series with said switching device in view) is fully effective (i.e. is effective to 100%). If however a specific item of said switching devices is switched fully-off, the parallel connection of the capacitor (in series with said switching device in view) is not effective at all (i.e. is effective to 0%). While said switching device in view is operating within its steady ramp-up/ramp-down or steady transition phase, the capacitor may be effectively switched in parallel with any value between 0% and 100%. The effectiveness of the switching in parallel of said capacitor is well controlled through the translinear amplifiers Tr.Amp 1 to Tr.Amp n and the relation of tuning and reference voltages, according to the input reference levels provided by the common reference circuit RefCirc. One can assume the steady transition area of RDS changing to be, for example, between the 2% point and the 98% point and define these limits as the desired end points of the steady transition area. Close to these end points, the linear operation of real switching devices come to a natural end.

The terms "steady ramp-up/ramp-down phase", "steady transition" and "steady transition phase" or "steady transition area" will be used throughout the document as synonyms, defining the phase of analog switching operation (i.e. steady ramp-up/ramp-down) as opposed to a pure digital switching operation (pure on/off). The area where said steady ramp-up/ramp-down is possible, is called the "steady ramp-up/ramp-down area" or "steady transition area". As said before, "steady" is meant in the mathematical sense of being virtually linear, free of jumps or breaks. In the same sense, the term "continual switching" means the ongoing process of "steady ramp-up/ramp-down switching". The term "area" in this context is used to express the "operating range"—the term "phase" is used to express the "operation in process" within said area.

Figure 7A:
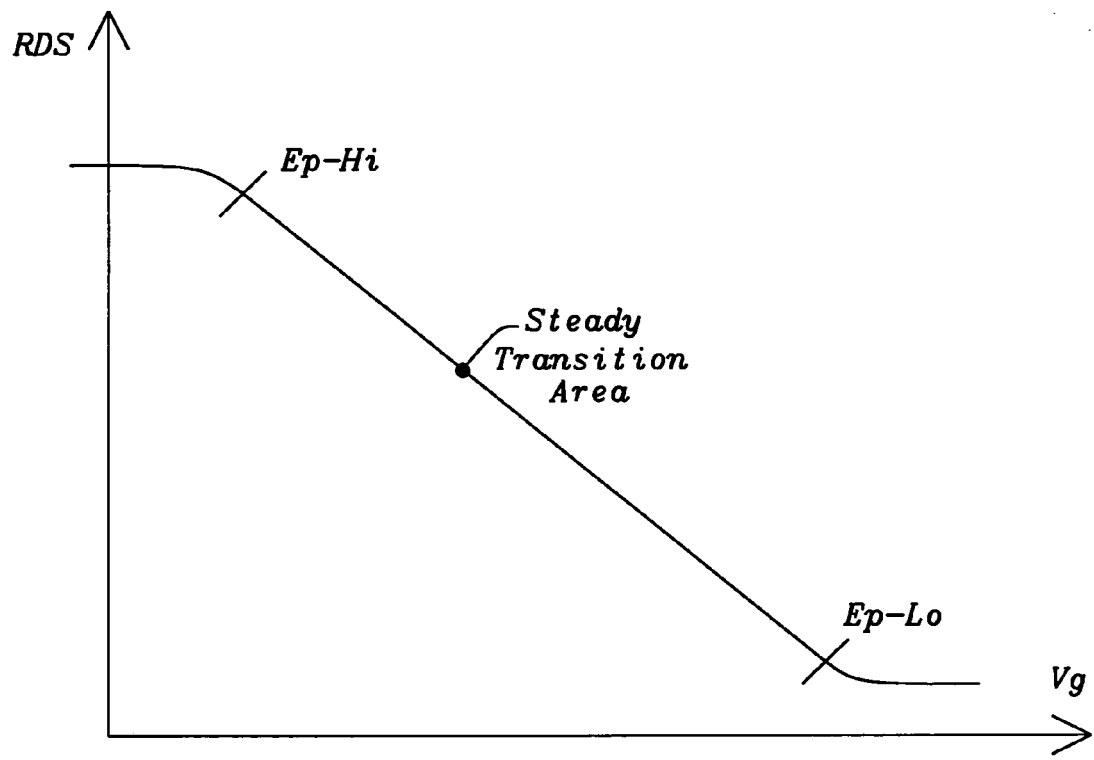
FIG. 7a shows the relation of a switching device's resistance RDS versus its gate voltage.

The linear operation of real switching devices is naturally limited, for example because it is reaching a switching transistor's saturation or because the resistance already reached the maximum achievable value and where, for example, a further change of gate voltage Vg would not create further increase of a switching transistor's resistance RDS. As explained before, the area of linear operation is called the "steady transition area", consequently the areas beyond the linear operating area are named here as the areas "outside the steady transition area". These are the areas where further change of the switch control signal Vsw would first cause only a non-linear change of resistance RDS and would finally have no more effect. In FIG. 7a the linear operating area and its end-points is shown: the Steady Transition Area, the end-point of the steady transition area at the low (RDS) resistance side of said switching device, marked Ep-Lo, and the end-point of the steady transition area at the high (RDS) resistance side of said switching device, marked EP-Hi. The switching device to switch on the capacitor is used for the presented patent application as a "switching device with a well controllable steady ramp-up/ramp-down area"; said device is in many cases shortly referenced in the instant document as "switching device".

Figure 4A:
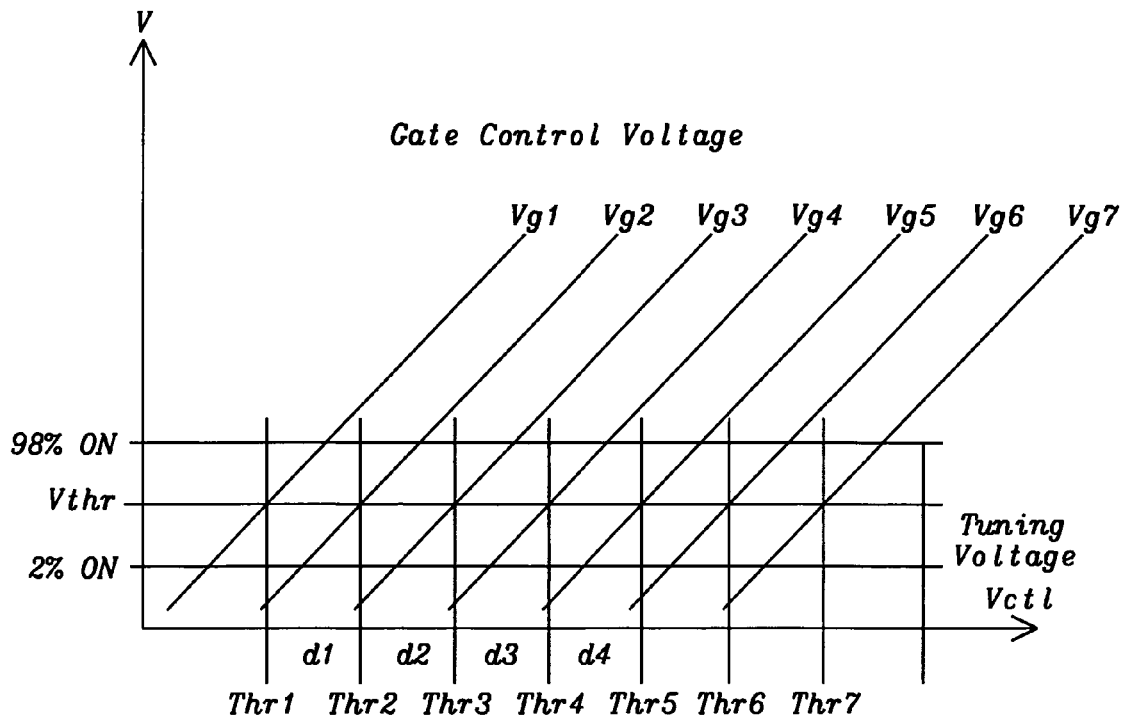
FIG. 4a shows the gate voltage versus tuning voltage relation for the chain of capacitor switching stages, according to FIG. 3.
Figure 4B:
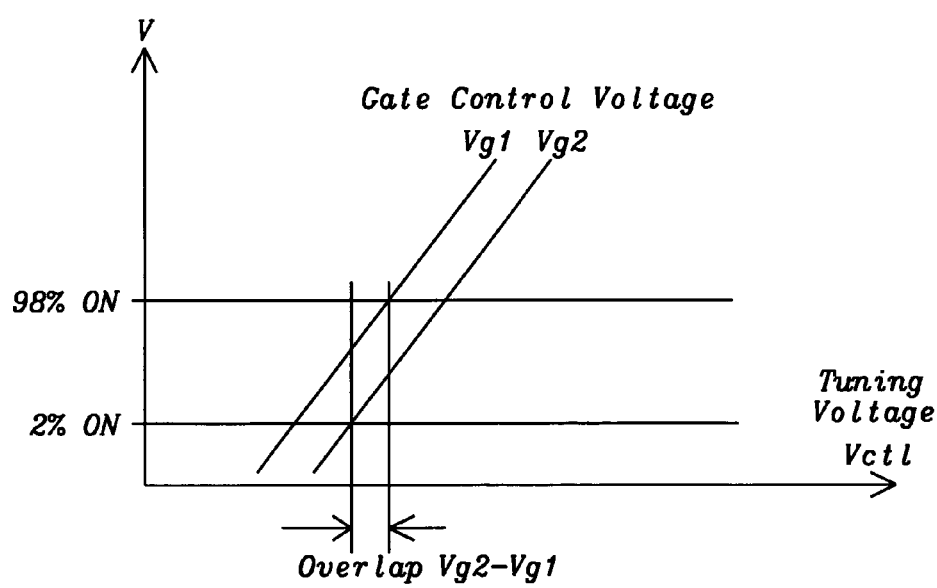
FIG. 4b visualizes the signal overlapping effect of the switching operations of just 2 stages of the circuit according to FIG. 3.
Figure 4C:
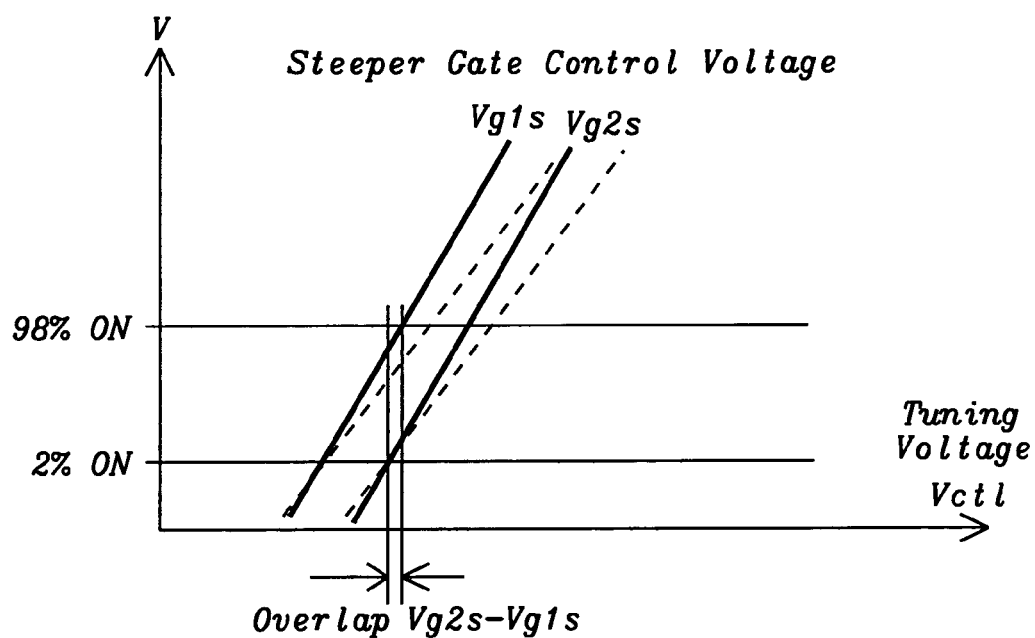
FIG. 4c visualizes the reduced signal overlapping effect of 2 adjacent stages with steeper control signals.

A detailed view on the individual ramp-up functions at each switching transistor's gate, of the circuit according to FIG. 6, is shown in FIG. 4a. Vg1 to Vg7 are the gate voltage versus tuning voltage slope of the switching stages number 1 to 7 in this example. One can assume for example, said switching transistor's steady change of resistance RDS between very high resistance and very low resistance to be effective between the measured 2% point and the 98% point, i.e. the crossing with the 2% line defines the start point of the steady ramp-up/ramp-down phase and the crossing with the 98% line defines its end point. All slopes of the individual gate voltages are strictly parallel. Threshold levels Th1 to Th7 in FIG. 4a may be equally spaced (distances d1 to d7 in FIG. 4a). FIG. 4b visualizes the overlapping switching operations of just 2 adjacent stages of the circuit according to FIG. 6. Overlap is a measure, where Vg2 just starts to switch on stage number 2 and where Vg1 is still operating in the steady transition area (i.e. the RDS steady changing mode) for stage number 1. Because said gate voltage versus tuning voltage slopes are all in parallel, all overlaps are normally the same. Selecting the distance of the threshold levels Th1 to Thn (by properly designing the circuit to generate said threshold levels) also determines the amount of overlap between adjacent switching stages. A translinear amplifier typically has a gain of 1. However, a gain different from 1 is also achievable, which, if implemented, gives one more degree of freedom in dimensioning the overlapping parameters: it allows to change the steepness of the gate control voltage change versus tuning voltage change. Now it is possible to select the switching overlap independent of the switching distance of adjacent capacitor switching stages. For example, the remaining overlapping of neighboring capacitor switching stages may be even further reduced, as the steepness of the steady ramp-up/ramp-down operation can be controlled with adequate selection of the gain. FIG. 4c demonstrates the reduced overlap of a steeper gate control voltage Vg1s and Vg2s of two adjacent capacitor switching stages, visualized as Overlap Vg2s-Vg1s.

Figure 9:
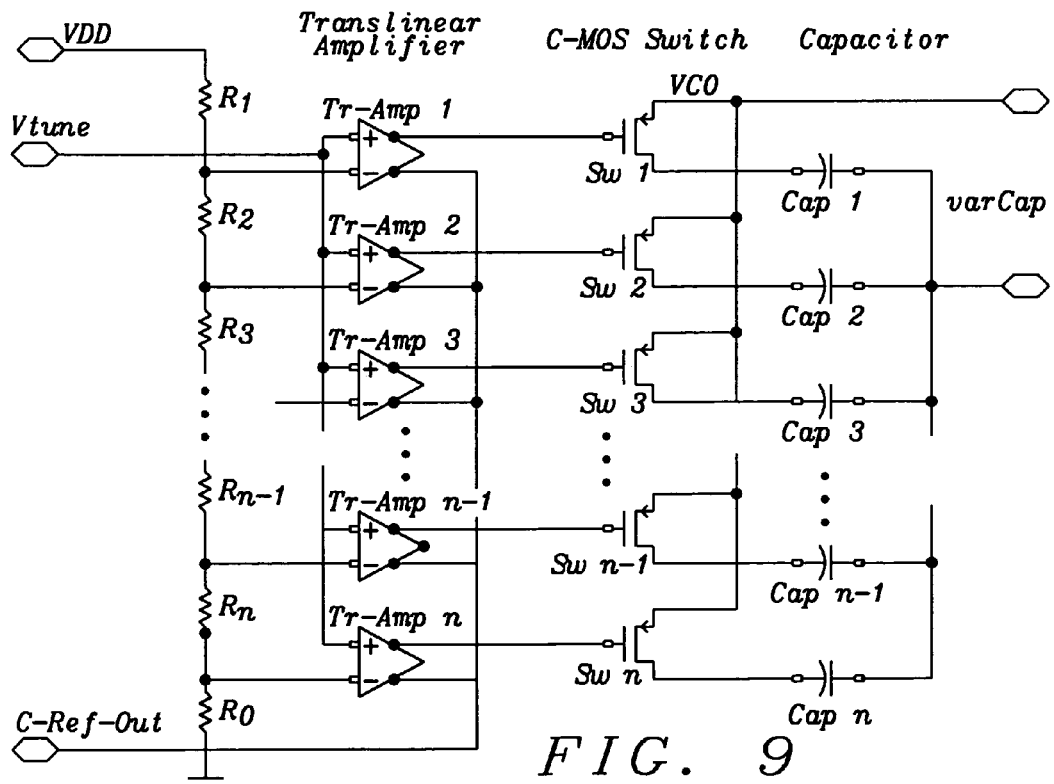
FIG. 9 shows a realistic circuit diagram of an implementation, in accordance with an embodiment of this invention.

There are various techniques for a circuit to generate a set of input and output reference values and to provide the threshold levels to each of said capacitor switching stages. And there are various techniques to provide a suitable input signal, dependent on the tuning voltage, dedicated for the voltage controlled capacitance change, to all of said capacitor switching stages. A conceptual circuit diagram for providing said input reference levels Ref-in 1 to Ref-in n and said output reference levels Ref-out 1 to Ref-out n is shown in FIG. 6. As shown in FIG. 9, one solution for said circuit to generate a set of input reference values is a simple resistor chain. A possible and minimal, though not the only, solution for a circuit to provide the input threshold levels Ref-in n and similarly to provide the tuning voltage Vtune, from inputs of said switching control circuit Switch-Ctrl to the therin embedded translinear amplifier, is to connect said individual threshold levels, as well as said tuning voltage, with simple wire connections to the appropriate input lines of said translinear amplifier, that is without using further intermittent electronic glue components, as anticipated inside said switching control circuit Switch-Ctrl in FIG. 5 and FIG. 6.

Similar to the input reference levels in FIG. 9, the output reference levels could be provided for example through a resistor network to provide individual output reference levels for each translinear amplifier (Ref-out-1 to Ref-out-n). Another possible and a minimal solution, providing an identical output reference level to all translinear amplifiers, could be to connect all output reference points of all translinear amplifiers (equivalent to Ref-out-1 to Ref-out-n in FIG. 6) to a common output reference level C-Ref-out, as it is shown in FIG. 9.

Figure 7B:
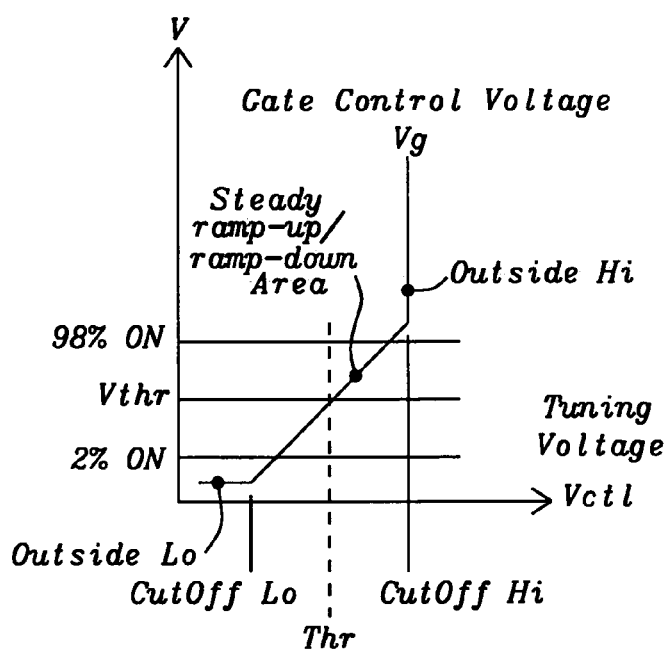
FIG. 7b visualizes said switching transistor's gate voltage versus capacitor tuning voltage dependency of a single stage.

Another key point of the invention is the implementation of signal cutoff functions at both ends of the steady ramp-up/ramp-down area. At the end-points of said steady transition area, where further linear change of the switch control signal Vsw would have nearly no further effect on the switching device to change its resistance RDS. After passing said end-points of said steady transition area, it would be desirable to not continue with a linear signal to control the switching device, but to apply a very steep signal change, thus driving the switching device very sharply into its minimum achievable resistance (RDSon as low as possible) or into its maximum achievable resistance (RDSoff as high as possible). Two additional circuits, CutOffC-Lo and CutOffC-Hi in FIG. 10a, perform said steep signal change, where one of said two additional circuits takes over full control of the switch control signal Vsw, i.e. they "override" the normal control signal, as provided by the translinear amplifier itself. The end-points of said steady transition area, where the steep signal change should appear are called the cut-off edges. Which of said two additional circuits is activated, depends on the switch status: to drive the switching device into minimum achievable resistance (RDSon as low as possible), the additional cut-off circuit CutOffC-Lo will be activated, or to drive the switching device into its maximum achievable resistance (RDSoff as high as possible) the additional cut-off circuit CutOffC-HI will be activated FIG. 7b of the instant document visualizes the idea of sharply cutting off said signal controlling the switching device as soon as a changing Gate Control Voltage Vg leaves the desired steady transition area Steady ramp-up/ramp-down Area at the cutoff edges CutOff Lo and CutOff Hi. For example, at the two desired points, beyond the 98% on-point, said signal Vg controlling the switching device is rised sharply and below the 2% on-point said signal Vg controlling the switching device is driven to rapidly switch-off. The area outside the desired steady transition area at the low (RDSon) resistance side of said switching device is marked Outside Lo, and the area outside the desired steady transition area at the high (RDSoff) resistance side of said switching device is marked Outside Hi. The end-points Ep-Lo and Ep-Hi in FIG. 7a correspond with the cutoff edges marked with CutOff Lo and CutOff Hi A possible solution for said signal cutoff functions could be to implement said signal cutoff functions as separate circuits in combination with, but external to said translinear amplifier. The principal concept of said two separate circuits for said signal cutoff functions is shown in FIG. 10a, with the two signal cut-off circuits CutOffC-Lo and CutOffC-Hi added to said (main) circuit to control the switching operation Switch-Ctrl of FIG. 5. These three circuits then operate together (possibly similar in function to a dotted-OR connection of said three circuits) to provide a combined control signal Csw for said switching device SW; Each cut-off circuit can thus override the output of the normal Switch-Ctrl circuit, once the switching device SW leaves the desired steady ramp-up/ramp-down area. Appropriate threshold elements will define the limits CutOff Lo and CutOff Hi of the steady ramp-up/ramp-down area, as shown in FIG. 7b and as explained above. Said possible threshold elements then provide the two control signals to either force said fully on or fully off state are CtlCutOff Lo and CtlCutOff Hi, Another possible solution could be to implement said signal cutoff functions within said translinear amplifier circuit. Such solution integrated into the translinear amplifier is presented in patent application U.S. Ser. No. 10/676,919, filed Oct. 1, 2003, which is hereby incorporated by reference. The relevant additional signal cutoff function is presented there on page 6, $3^{rd}$ and $4^{th}$ paragraph, on page 14, $1^{st}$ and $2^{nd}$ paragraph, page 15 $2^{nd}$ full paragraph, on page 17, $1^{st}$ and $2^{nd}$ paragraph and in FIG. 7 with the additional circuits ADD-COMP 1-7 and ADD-COMP 2-7. Circuit ADD-COMP 2-7 in the referenced companion application is a real implementation of a cut-off circuit CutOffC-Lo in FIG. 10a of the instant application and circuit ADD-COMP 1-7 in the referenced companion application provides the control signal defined as CtlCutOff Lo in the instant application. The referenced application describes the implementation of the signal cutoff functions as cited in the following paragraph:

The envisioned solution is described in the first full paragraph on page 14 in the referenced patent application U.S. Ser. No. 10/676,919: "According to said second aspect, two additional circuit functions sharply limit the analog operating region through an extra current limiting transistor on one side and the purposely use of the voltage limited by the power supply on the other side. Key objective is to linearly control said translinear amplifier's output, for example for switching on or off a transistor in an application like it is shown in FIG. 4 (of the referenced patent application), and getting sharp cutoff edges, for example for switching on or off a transistor in said application to achieve minimum RDSon and maximum of RDSoff at the extreme ends. The desired output characteristic is visualized in FIG. 5 (of the referenced patent application)."

Further explanation of the additional circuit is found in the first paragraph on page 17 in the referenced patent application U.S. Ser. No. 10/676,919: "FIG. 7 (of the referenced patent application) shows the circuit of FIG. 6 with the additional limiting transistor function, where the additional components are shown inside the dashed frames, marked with ADD-COMP 1-7 and ADD-COMP 2-7. According to said second aspect of this invention, two additional circuit functions sharply limit the analog operating region through an extra current limiting transistor on one side and the purposely use of the voltage limited by the power supply on the other side. Transistor N13-7 incorporates said current limiting transistor.

( . . . ) As soon as the current drawn by N13-7 exceeds the current provided by N8-7, N13-7 sinks all available current and the output is cut-off."

And even further in the second paragraph on page 17 in the referenced Patent Application: "Similar, when the output voltage Voutp-7 swings to Vdd, further voltage increase is suddenly impossible, thus sharply limiting said linear operation region" in the desired way.

The specific implementation of the signal cutoff function integrated within said translinear amplifier of the referenced application takes advantage of the fact, that the output signal can completely swing up to the power supply rail, driving the Gate-Source Voltage of the switching device to zero, thus forcing a PMOS switch to go into high impedance state without any further measures. In case the output signal could not swing up to the power supply rail or if a different type of switching device is used, an additional circuit similar in function to the circuits ADD-COMP 1-7 and ADD-COMP 2 would be implemented.

Figure 8:
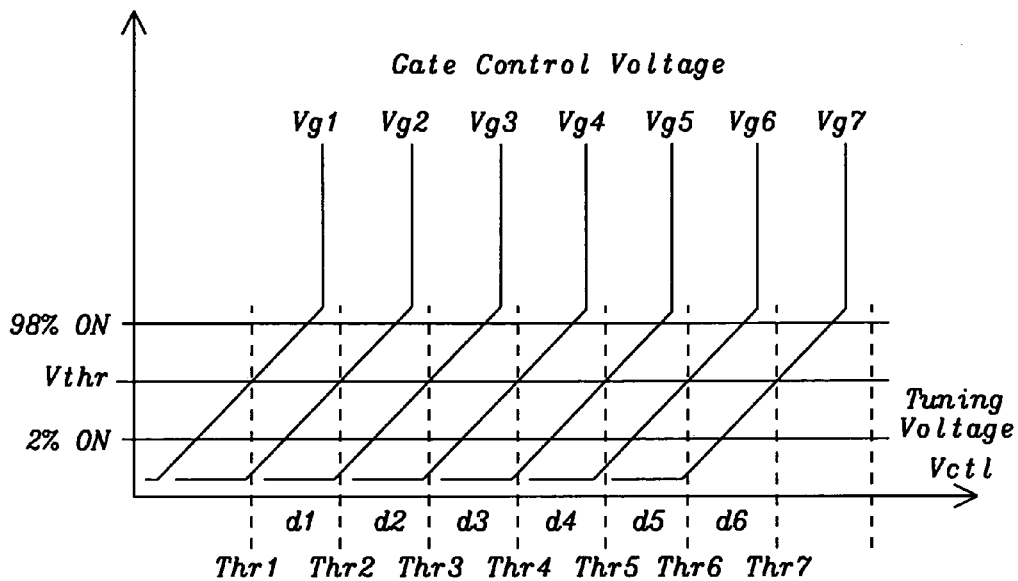
FIG. 8 visualizes said switching transistor's gate voltage, versus capacitor tuning voltage dependency of a multiple stages.

FIG. 8 presents the same behavior as FIG. 7b for a larger number of said capacitor switching stages. Th1 to Thn are the selected threshold for said switching to occur. d1 to dn are the distances of said threshold, that normally are dimensioned to equal distance. The capacitor tuning voltage Tuning Voltage Vctl is supplied to all capacitor switching stages as a common signal.

FIG. 9 shows a realistic circuit diagram of an implementation, in accordance with an embodiment of this invention. Tr.Amp 1 to Tr.Amp n are said translinear amplifiers, Sw 1 to Sw n are the switching devices and Cap 1 to Cap n are said capacitors that will be switched in parallel, resulting in the total capacitance varcap. R1 to Rn build the resistor chain to produce references voltages for the amplifier of each stage, as an implementation of the reference circuit shown in FIG. 6. Similar to FIG. 6, the combination of one translinear amplifier Tr.Amp k, combined with adequate control circuit and one switching device Sw k could be considered as an individual capacitor switching stage, where one of said capacitor switching stages connects to one capacitor Cap k out of a set of small capacitors. Each of said capacitor switching stages is controlled through the common input Vtune and an individual input reference level Ref-in k. In the implementation shown in FIG. 9, the output reference signals Ref-out k of FIG. 6 are all connected to a common output reference signal C-Ref-out. All of these stages k=1 to n have basically identical functional characteristics.

Furthermore, a concept of this disclosure is to compensate the temperature deviation, caused by the temperature characteristics of the switching device; FIG. 10b presents this concept, which shows a temperature compensating circuit Temp-Comp in addition to said circuit to control the switching operation Switch-Ctrl, as shown in FIG. 5. One method is to use a device N2-10 of the identical type of the switching device N1-10 to produce a temperature dependent signal. A temperature compensating voltage, produced by said device N2-10, is added to the output reference signal Ref-out-10, now resulting in a temperature compensated output reference signal Ref-out-c-10. The input of said temperature compensating circuit Temp-Comp is connected to one of the output reference signals of the common reference circuit RefCirc of FIG. 6 and it's the output of said temperature compensating circuit Temp-Comp then provides a compensated signal to the output reference point Voutn-10 of the translinear amplifier. This compensation technique will mirror the exact equivalent of the temperature error into the switching control signal Vg and compensate its temperature error. The output reference point Voutn-10 in FIG. 10b is the same point as the reference signals Ref-out in FIG. 5. Within each a set of multiple capacitor switching stages, there is one of said temperature compensating circuits.

Figure 10C:
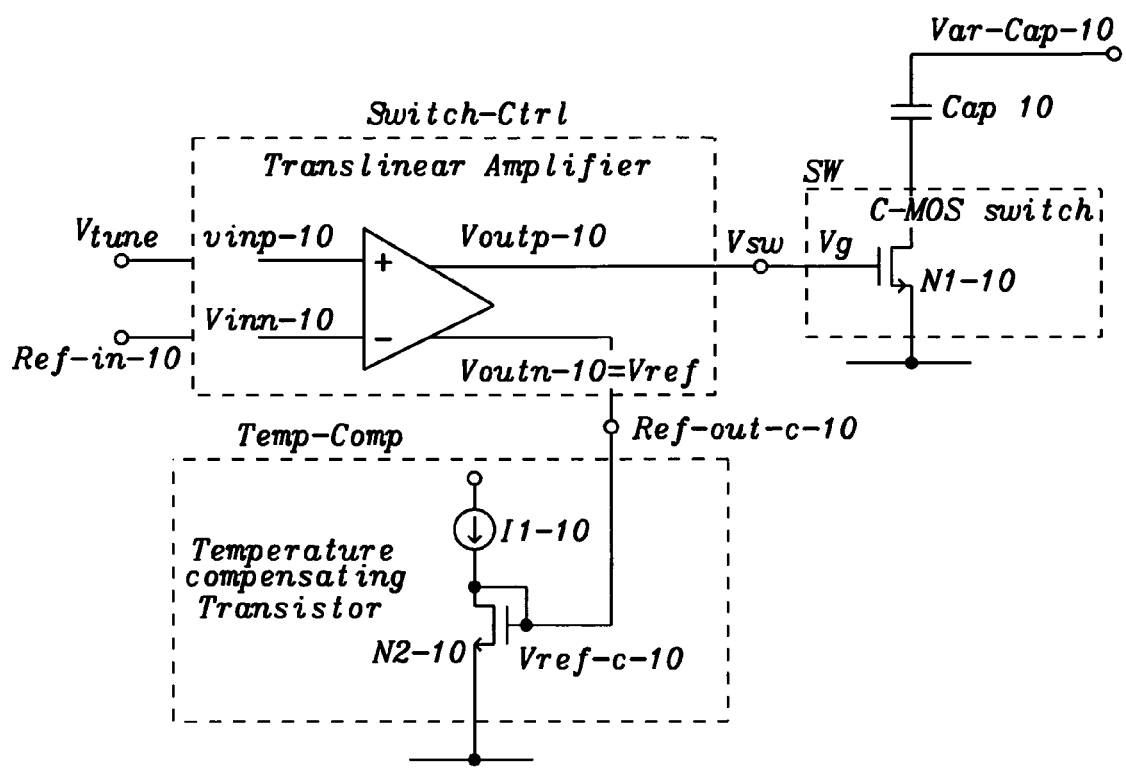
FIG. 10c shows an added circuit to generate a temperature compensated reference voltage.

As already described with FIG. 9, a simplified solution providing an identical output reference level to all translinear amplifiers could be to connect a common signal to all output reference points Ref-out (equivalent to Voutn of the translinear amplifiers) in common. In the case of providing an identical temperature compensated reference voltage as a common signal, it would be sufficient to implement a single temperature compensating circuit to serve all said output reference points Ref-out in common. FIG. 10c presents such simplified and common temperature compensating circuit.

Figure 11A:
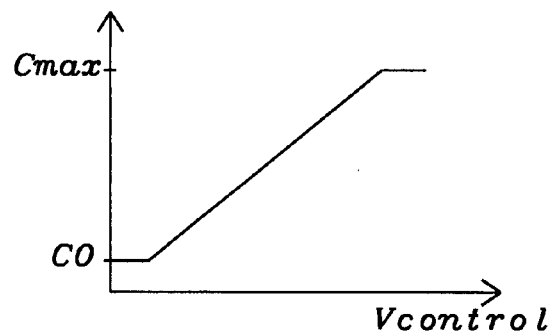
FIG. 11a demonstrates the resulting capacitance versus tuning voltage for multiple capacitor switching stages, according to FIG. 6.
Figure 11B:
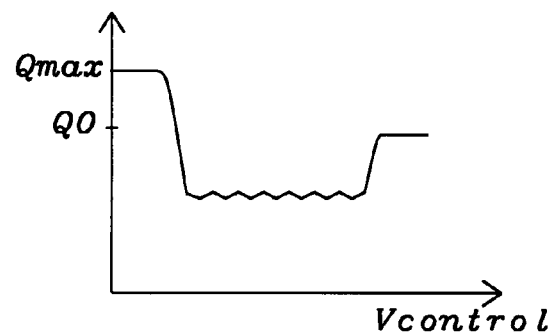
FIG. 11b demonstrates the resulting Q-factor versus tuning voltage for multiple capacitor switching stages, according to FIG. 6.

The total capacitance versus tuning voltage characteristic for a circuit with n-stages is demonstrated in FIG. 11a and the overall characteristic of said Q-factor is presented in FIG. 11b.

Figure 12:
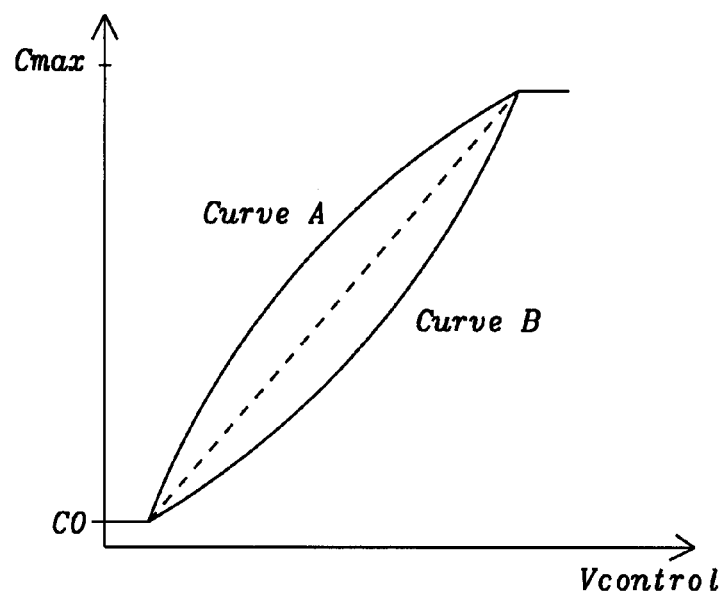
FIG. 12 demonstrates 2 possible variations of capacitance versus tuning voltage characteristics.

Typically, it would be desirable to achieve a linear relation between the tuning voltage and the capacitor variation, i.e. in a strictly linear mode. Then the reference voltages to compare with the tuning voltage would normally be equally spaced. However, to achieve a steady, but predefined non-linear relation instead, other reference voltage steps for said threshold levels could also be selected, like spacing along a parabolic curve. As explained before, one circuit example is said resistor chain R1 to Rn, or a similar circuit, to produce a series of voltage references Ref 1 to Ref n, where each of said translinear amplifiers compares the tuning voltage with its dedicated reference voltage. To achieve a non-linear relation between threshold levels and tuning voltage, a set of reference voltages will be provided, that are, instead of being equally spaced, spaced along a desired non-linear curve. As one suggested embodiment, such non-linear relation can be achieved by appropriate selection of the values of said resistor chain R1 to Rn. Similar, the tuning voltage could be split into a multiple of tuning signals to feed them to the translinear amplifier inputs. Depending on the technique to implement the reference values defining said threshold levels for each of the translinear amplifiers within said chain of said capacitor switching stages, specific nonlinear relations of capacitance change versus tuning voltage can be constructed. The concept of said non-linear relation is demonstrated in FIG. 12, with Curve A and Curve B as examples.

In accordance with the objectives of this invention, a set of individual capacitors is implemented. Such capacitors could be metal or polymer capacitors, eventually mounted or fabricated on a common planar carrier or they could be integrated on a semiconductor substrate. The advantage of a capacitor not being of the junction (diode) type capacitor is the invariance due to voltage or temperature at the capacitor. The switching device is typically a FET transistor, which could be for example a P-channel or N-channel junction FET or a PMOS or NMOS FET. In the case complementary components are used all voltage levels would just be inverted without changing the principals of operation.

Figure 13:
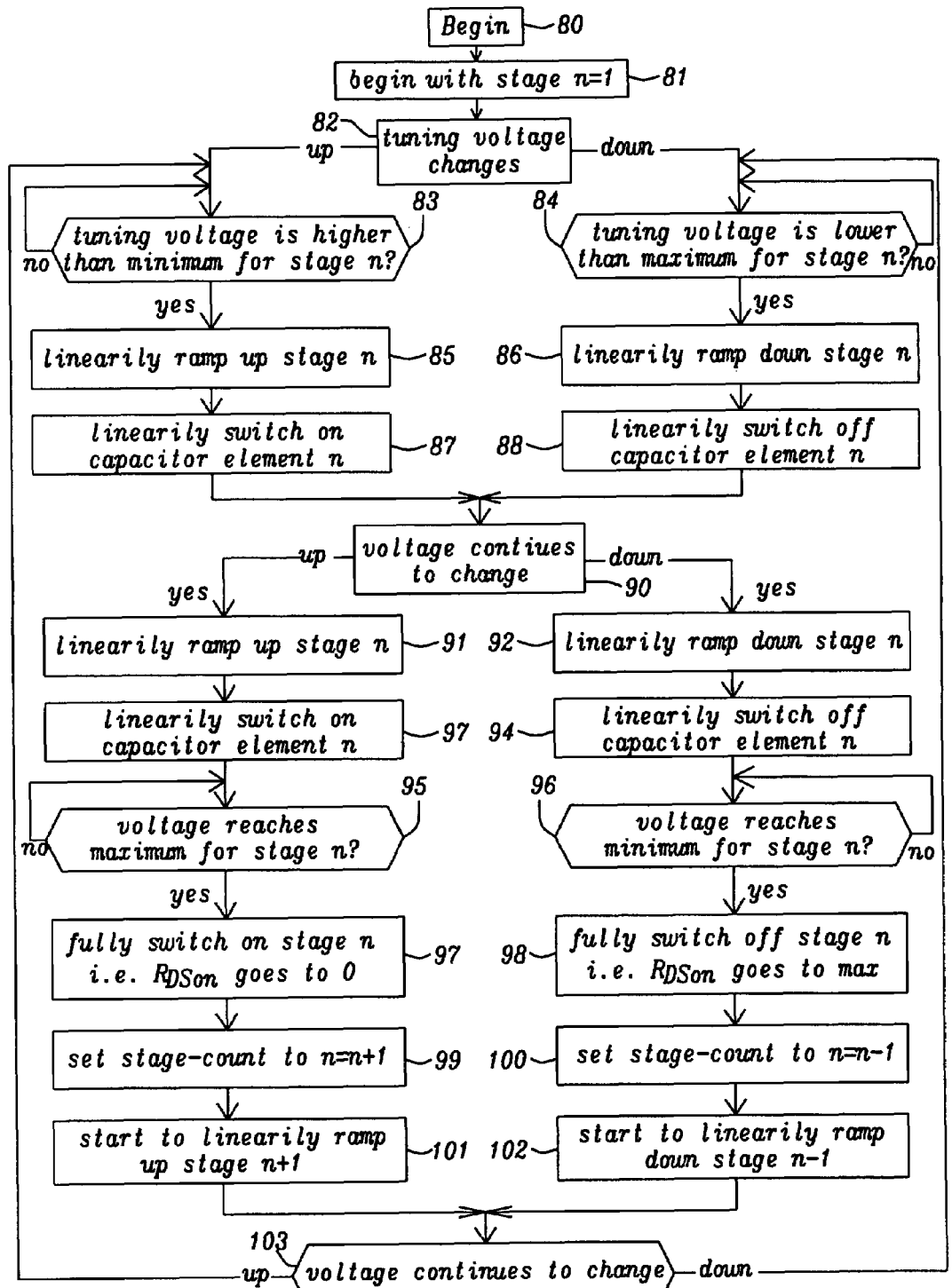
FIG. 13 visualizes the methods to control the capacitance of a variable capacitor in a strictly linear mode through a tuning voltage and achieving a high Q-factor.

The method to achieve the objectives of this invention is illustrated in FIG. 13. First (80), it starts with just the first capacitor, i.e. the count n=1 (81). When the tuning voltage is rising (82) or is high enough (83), the amplifier ramps up (85) and the switching device linearly switches on capacitor element n (87). If the tuning voltage continues to rise (90) the amplifier continues to ramp up (91). If however the tuning voltage turns down (90), the amplifier will ramp down as well (92). Once the tuning voltage reaches the upper limit of the steady transition area (95), the switching device of stage n is fully switched on (97) and the process continues with the next step n=n+1 (99)(101). Depending on the direction of continued voltage change (103) it continues to ramp up or down. In case tuning voltage is lower than maximum for stage n (84), the amplifier ramps down (86) and the switching device linearly switches off capacitor element n (88). Once the tuning voltage reaches the lower limit of the steady transition area (96), the switching device of stage n is fully switched off (98) and the process continues with the next step n=n−1 (100) (102). Again, depending on the direction of continued voltage change (103) it continues to ramp up or down and restarts at (82).

While the invention has been particularly shown and described with reference to the preferred embodiments thereof, it will be understood by those skilled in the art that various changes in form and details may be made without departing from the spirit and scope of the invention.

What is claimed is:

1. A circuit to control the capacitance of a variable capacitor in a strictly linear mode through a steady tuning voltage and to achieve a high Q-factor at the same time; comprising:
   a set of individual small capacitors;
   a set of capacitor switching stages, each stage comprising;
      a switching device, allowing a steady ramp-up/ramp-down phase between the points of being fully switched on and fully switched off, and where said switching device is connected in series with one of said capacitors, to connect a multiple of said capacitors in parallel;
      a circuit to control the switching operation of said switching device in a steady ramp-up/ramp-down manner between the points of being fully switched on and fully switched off, comprising:
         a translinear amplifier to produce a ramp-up/ramp-down signal for said switching device, where said translinear amplifier is implemented within said circuit to control the switching operation;
   a common circuit to provide a set of input and output reference levels for each of said capacitor switching stages, used as input reference levels and output reference levels for each of said translinear amplifiers, comprised within said circuits to control the switching operation; and
   input signals, each dependent on the tuning voltage, dedicated for the voltage controlled capacitance change, provided to an input of all of said capacitor switching stages.

2. The circuit of claim 1 wherein said switching device with steady ramp-up/ramp-down phase is a FET transistor.

3. The circuit of claim 2 wherein said switching device with steady ramp-up/ramp-down phase is a P-channel or N-channel junction FET.

4. The circuit of claim 2 wherein said switching device with steady ramp-up/ramp-down phase is a PMOS or NMOS FET.

5. The circuit of claim 1 wherein said circuit to generate a set of input reference levels, one for each of said capacitor switching stages, is implemented as a chain of resistors.

6. The circuit of claim 1 wherein said translinear amplifier has a gain of 1, the typical gain of translinear amplifiers.

7. The circuit of claim 1 wherein said translinear amplifier has a gain differing from 1, which gives one more degree of freedom to optimize the operating parameters by making the steepness of the switching device's gate control voltage versus tuning voltage adjustable through proper gain selection, thus making the overlapping of capacitor switching operation independent of the selected distance of the switching points of adjacent capacitor stages.

8. The circuit of claim 1 wherein said circuit to provide a signal, dependent on the tuning voltage, dedicated for the voltage controlled capacitance change, is a single signal connected to all of said capacitor switching stages.

9. The common circuit of claim 1 to provide said set of input and output reference levels for each of said capacitor switching stages, implements said output reference levels for said translinear amplifiers, by a single signal, connected to all translinear amplifier's output reference points in common.

10. The circuit of claim 1 wherein said capacitors are discrete capacitor components.

11. The circuit of claim 1 wherein said capacitors are manufactured on a planar carrier, separate from the circuit carrier.

12. The circuit of claim 1 wherein said capacitors are integrated on a semiconductor substrate, but on a separate substrate than said switching devices and amplifiers.

13. The circuit of claim 1 wherein said capacitors are integrated on a semiconductor substrate and on the same substrate as said switching devices and amplifiers.

14. The circuit of claim 1 wherein said capacitors are manufactured as a Metal-Oxide structure.

15. The circuit of claim 1 wherein said capacitors are manufactured as a junction capacitor.

16. A circuit to control the capacitance of a variable capacitor in a strictly linear mode through a steady tuning voltage and to achieve a high Q-factor at the same time, by controlling a multiple of switching devices through steady control signals when said switching devices operate within their steady ramp-up/ramp-down area and by sharply cutting off the control signals, when said switching devices operate outside their steady ramp-up/ramp-down area; comprising:
  a set of individual small capacitors;
  a set of capacitor switching stages, each stage comprising:
    a switching device allowing said steady ramp-up/ramp-down phase between the points of being fully switched on and fully switched off, and where said switching device is connected in series with one of said capacitors, to connect a multiple of said capacitors in parallel;
    a circuit to control the switching operation of said switching device in a steady ramp-up/ramp-down manner, comprising:
      a translinear amplifier to produce a steady ramp-up/ramp-down signal for said switching device, where said translinear amplifier is implemented within said circuit to control the switching operation;
      a first cut-off circuit to drive said switching device to a fully on status, when said switching device operates outside said steady ramp-up/ramp-down area on said switching device's low resistance side, and implemented in combination with said translinear amplifier;
      a second cut-off circuit to drive said switching device to a fully off status, when said switching device is beyond said steady ramp-up/ramp-down area on said switching device's high resistance side, and implemented in combination with said translinear amplifier;
  a common circuit to provide a set of input and output reference levels for each of said capacitor switching stages, used as input reference levels and output reference levels for each of said translinear amplifiers, comprised within said circuits to control the switching operation; and
  input signals, each dependent on the tuning voltage, dedicated for the voltage controlled capacitance change, provided to an input of all of said capacitor switching stages.

17. The circuit of claim 16 wherein said first cut-off circuit to drive said switching device to a fully-on status, when said switching device operates outside its desired steady transition area on the lower resistance side is provided by additional circuit elements, working as a signal cutoff function.

18. The circuit of claim 16 wherein said a second cut-off circuit to drive said switching device to a fully-off status, when said switching device operates outside its desired steady transition area on the higher resistance side is provided by additional circuit elements, working as a signal cutoff function.

19. The first cut-off circuit of claim 17 to drive said switching device to a fully-on status, when said switching device operates outside its desired steady ramp-up/ramp-down area on said switching device's low resistance side, is implemented as a signal cutoff function within said translinear amplifier circuit.

20. The second cut-off circuit of claim 18 to drive said switching device to a fully-off status, when said switching device operates outside its desired steady ramp-up/ramp-down area on said switching device's high resistance side, is implemented as a signal cutoff function within said translinear amplifier circuit.

21. The circuit of claim 16 wherein said translinear amplifier has a gain of 1, the typical gain of translinear amplifiers.

22. The circuit of claim 16 wherein said translinear amplifier has a gain differing from 1, which gives one more degree of freedom to optimize operating parameters, like overlapping of capacitor switching operation and signal cutoff at the edges of said steady ramp-up/ramp-down area.

23. A circuit to control the capacitance of a variable capacitor in a strictly linear mode through a steady tuning voltage and to achieve a high Q-factor at the same time, by controlling a multiple of capacitor switching devices through steady control signals and by compensating the temperature deviation of said capacitor switching devices; comprising:
  a set of individual small capacitors;
  a set of capacitor switching stages, each stage comprising:
    a switching device allowing a steady ramp-up/ramp-down phase between the points of being fully switched on and fully switched off, and where said switching device is connected in series with one of said capacitors to connect a multiple of said capacitors in parallel;
    a circuit to control the switching operation of said switching device, in a steady ramp-up/ramp-down manner, comprising:
      a translinear amplifier to produce a control signal for said switching device, and implemented within said circuit to control the switching operation;
      a temperature compensating circuit to compensate the temperature deviation of said switching device, and connected to an output reference point of said circuit to control the switching operation;
  a common circuit to provide a set of input and output reference levels for each of said capacitor switching stages, used as input reference levels and output reference levels for each of said translinear amplifiers, comprised within said circuit to control the switching operation; and
  input signals, each dependent on the tuning voltage, dedicated for the voltage controlled capacitance change, provided to an input of all of said capacitor switching stages.

24. The circuit of claim 23 wherein said temperature compensating circuit to compensate the temperature deviation of said switching device is provided by feeding a modified reference voltage to said translinear amplifier's output reference point, to mirror a temperature correcting signal into the control signal of said switching device.

25. The circuit of claim 24 wherein said temperature compensating circuit to compensate the temperature deviation of said switching device, uses a device of the same type as said switching device itself, to produce an exact equivalent of said temperature deviation.

26. The circuit of claim 1 wherein said common circuit to individually provide said input reference levels for each of said capacitor switching stages, generates a set of reference values, one value for each capacitor switching stage, in a non-linear relation between said tuning voltage and said input reference levels.

27. The circuit of claim 26 wherein said common circuit to individually provide said input reference levels, for each circuit to control the switching operation in a non-linear relation between said tuning voltage and said input reference levels, is provided by specifically selecting the steps of a set of reference values in a way, to achieve said desired non-linear relation.

28. The circuit of claim 27 wherein said common circuit to generate said set of input reference levels, one for each of said circuit to control the switching operation in a non-linear relation, is implemented as a chain of resistors.

29. A method to control the capacitance of a variable capacitor in a strictly linear mode through a tuning voltage and to achieve a high Q-factor at the same time; comprising:
providing a set of individual small capacitors, a set of capacitor switching stages, each comprising: a switching device allowing a steady ramp-up/ramp-down phase between the points of being fully switched on and fully switched off, and where said switching device is connected in series with one of said capacitors, to connect a multiple of said capacitors in parallel, a circuit to control the switching operation of said switching device in a ramp-up/ramp-down manner between the points of being fully switched on and fully switched off and comprising a translinear amplifier, a common circuit to provide a set of input reference levels and output reference levels for said capacitor switching stages, and input signals, dependent on the tuning voltage and dedicated for the voltage controlled capacitance change;
providing an individual input reference level and an output reference level for each capacitor switching stage;
supplying one of said input signals, dependent on the tuning voltage, dedicated for a voltage controlled capacitance change, to all of said capacitor switching stages;
amplifying, by means of said translinear amplifier, a difference of said tuning voltage and said input reference level within each capacitor switching stage, to produce a linear control signal for a ramp-up/ramp-down switching operation;
fully switching on one of said switching devices in order to completely switch one of said small capacitors in parallel to the already switched on capacitors, one after the other to linearly increase the total capacitance;
fully switching off one of said switching devices in order to completely disconnect one of said small capacitors from the other switched on capacitors, one after the other, to linearly decrease the total capacitance; and
ramping up or ramping down the switching operation of one of said switching devices to partially switch, with increasing or decreasing share, one of said small capacitors in parallel to the already switched on capacitors, one after the other.

30. The method of claim 29 wherein linearly controlling the switching operation applies to a FET transistor as the switching device with steady ramp-up/ramp-down phase.

31. The method of claim 30 wherein linearly controlling the switching operation applies to a P-channel or N-channel junction FET as said switching device with steady ramp-up/ramp-down phase.

32. The method of claim 30 wherein linearly controlling the switching operation applies to a P-channel or N-channel MOS FET as said switching device with steady ramp-up/ramp-down phase.

33. The method of claim 29 wherein individually providing said input and output reference levels for each individual capacitor switching stage, generates two sets of reference values, one set of input reference levels and one set of output reference levels.

34. The method of claim 33 wherein generating a set of reference values, one for each of said capacitor switching stages, is performed by a chain of resistors.

35. The method of claim 29 wherein continually switching on one of said small capacitors in parallel to the already switched on capacitors applies to discrete capacitor components.

36. The method of claim 29 wherein continually switching on one of said small capacitors in parallel to the already switched on capacitors applies to capacitors manufactured on a planar carrier, separate from the circuit carrier.

37. The method of claim 29 wherein continually switching on one of said small capacitors in parallel to the already switched on capacitors applies to capacitors integrated on a semiconductor substrate.

38. The method of claim 29 wherein supplying a tuning voltage, dedicated for the voltage controlled capacitance change, to all of said capacitor switching stages uses a single signal connected to all amplifier inputs.

39. A method to control the capacitance of a variable capacitor in a strictly linear mode through a tuning voltage and to achieve a high Q-factor at the same time by sharply cutting off the control signal, when a switching device operates outside its steady ramp-up/ramp-down area; comprising:
providing a set of individual small capacitors, a set of capacitor switching stages, each comprising: a switching device allowing a steady ramp-up/ramp-down phase between the points of being fully switched on and fully switched off, and where said switching device is connected in series with one of said capacitors, to connect a multiple of said capacitors in parallel, a circuit to control the switching operation of said switching device in a ramp-up/ramp-down manner between the points of being fully switched on and fully switched off and comprising, in addition to a translinear amplifier, a first cut-off circuit to drive it to a fully-on status, as well as a second cut-off circuit to drive it to a fully-off status, a common circuit to provide a set of input reference levels and output reference levels for said capacitor switching stages, and input signals, dependent on the tuning voltage and dedicated for the voltage controlled capacitance change;
providing an individual input reference level for each capacitor switching stage;
supplying one of said input signals, dependent on the tuning voltage, dedicated for a voltage controlled capacitance change, to all of said capacitor switching stages;
amplifying, with said translinear amplifier, the difference of said tuning voltage and said individual input reference level within each capacitor switching stage, to produce a linear control signal for a ramp-up/ramp-down switching operation;

steadily ramp-up/ramp-down switching on or off said switching device in order to partially switch, with increasing or decreasing share, said small capacitor in parallel to the already switched on capacitors, one after the other, to linearly increase or decrease the total capacitance;

linearly controlling the switching function for each of said switching device with steady ramp-up/ramp-down phase, when said switching device is in its steady ramp-up/ramp-down area;

activating said first cut-off circuit, when said switching device operates outside its steady ramp-up/ramp-down area on said switching device's low resistance side and thus taking over full control of said switching device by driving it to a fully-on state; and activating said second cut-off circuit, when said switching device is beyond its steady ramp-up/ramp-down area on said switching device's high resistance side, and thus taking over full control of said switching device by driving it to a fully-off state.

40. The method of claim 39 wherein driving said switching device to a fully-on status, when said switching device operates outside its desired steady ramp-up/ramp-down area on said switching device's low resistance side uses additional circuit elements, working as a signal cutoff function.

41. The method of claim 39 wherein driving said switching device to a fully-off status, when said switching device operates outside its steady ramp-up/ramp-down area on said switching device's high resistance side uses additional circuit elements, working as a signal cutoff function.

42. The method of claim 40 wherein said signal first and/or second cutoff function to drive said switching device to a fully-on status, when said switching device operates outside its steady ramp-up/ramp-down area on the low resistance is implemented within said translinear amplifier.

43. A method to control the capacitance of a variable capacitor in a strictly linear mode through a tuning voltage and to achieve a high Q-factor at the same time and to compensate the temperature deviation of the capacitor switching device; comprising:

providing a set of individual small capacitors, a set of capacitor switching stages, each comprising: a switching device with steady ramp-up/ramp-down phase to continually switch on said capacitors in parallel, a circuit to control the switching operation of said switching device and comprising a translinear amplifier, a temperature compensating circuit to compensate the temperature deviation of said switching device, a common circuit to provide set of input reference levels and output reference levels for each individual capacitor switching stage, and input signals, dependent on the tuning voltage and dedicated for the voltage controlled capacitance change;

providing an individual input reference level and an output reference level for each capacitor switching stage;

supplying one of said input signals, dependent on the tuning voltage, dedicated for the voltage controlled capacitance change, to all of said capacitor switching stages;

amplifying, with said translinear amplifier, the difference of said tuning voltage and said individual input reference level within each capacitor switching stage, to produce a linear control signal for a ramp-up/ramp-down switching operation;

continually switching on one of said switching devices with steady ramp-up/ramp-down phase in order to switch one of said small capacitors in parallel to the already switched on capacitors, one after the other;

linearly controlling the switching function for each of said switching devices with steady ramp-up/ramp-down phase; and compensating the temperature deviation of said switching device, using said temperature compensating circuit to compensate the temperature deviation of said switching device and providing a compensated output reference level to said circuit to control the switching operation.

44. The method of claim 43 wherein compensating the temperature deviation of said switching device is provided by feeding a modified reference voltage to said translinear amplifier's output reference point, to mirror a temperature correcting signal into the control signal of said switching device.

45. The method of claim 44 compensating the temperature deviation of said switching device, uses a device of the same type as said switching device itself, to produce an exact equivalent of said temperature deviation.

46. The method of claim 29 wherein individually providing said input reference levels for each individual capacitor switching stage generates a set of reference values, one value for each capacitor switching stage in a non-linear relation between said tuning voltage and said input reference levels.

47. The method of claim 46 wherein providing a non-linear relation between said tuning voltage and said input reference levels is provided by specifically selecting the steps of said set of reference values in a way, to achieve said desired non-linear relation.

* * * * *